(12) United States Patent
Naiki

(10) Patent No.: US 6,849,929 B2
(45) Date of Patent: Feb. 1, 2005

(54) IC CHIP AND SEMICONDUCTOR DEVICE

(75) Inventor: Takashi Naiki, Kyoto (JP)

(73) Assignee: Rohm Co., LTD, Kyoto (JP)

( * ) Notice: Subject to any disclaimer, the term of this patent is extended or adjusted under 35 U.S.C. 154(b) by 0 days.

(21) Appl. No.: 10/667,073

(22) Filed: Sep. 18, 2003

(65) Prior Publication Data

US 2004/0070054 A1 Apr. 15, 2004

Related U.S. Application Data

(62) Division of application No. 09/964,246, filed on Sep. 25, 2001, now abandoned.

(30) Foreign Application Priority Data

Sep. 29, 2000 (JP) .......................................... 2000-298334

(51) Int. Cl.[7] .......................... H01L 23/62; H01L 29/00; H01L 23/48; H01L 23/52; H01L 29/40
(52) U.S. Cl. ........................ 257/665; 257/529; 257/786; 257/528
(58) Field of Search ................................ 257/665, 528, 257/529, 777, 784, 786

(56) References Cited

U.S. PATENT DOCUMENTS

| | | | | |
|---|---|---|---|---|
| 4,587,638 A | * | 5/1986 | Isobe et al. | 365/200 |
| 5,608,257 A | | 3/1997 | Lee et al. | 257/529 |
| 5,703,817 A | * | 12/1997 | Shiratake et al. | 365/200 |
| 6,163,062 A | * | 12/2000 | Shiratake et al. | 257/529 |
| 6,278,128 B1 | * | 8/2001 | Noji et al. | 257/48 |
| 6,664,174 B2 | * | 12/2003 | Ema et al. | 438/601 |

FOREIGN PATENT DOCUMENTS

| | | | | |
|---|---|---|---|---|
| JP | 61268220 | * | 11/1986 | 21/82 |
| JP | 63122150 A | | 5/1988 | H01L/21/82 |
| JP | 63122150 | * | 5/1988 | 21/82 |
| JP | 63289335 A | | 11/1988 | H01L/21/82 |

* cited by examiner

Primary Examiner—Victor A. Mandala, Jr.
(74) Attorney, Agent, or Firm—Hogan & Hartson LLP

(57) ABSTRACT

An IC chip has externally and selectively cuttable members F1–F3, which can be cut, or cut open, at more than one cuttable points C1 and C2. So long as at least one of the multiple cuttable points C1 and C2 remains cut open, the cuttable member works as a cut member. Thus, a cut member has an exceedingly small probability that it is short-circuited by particles in an ACF or by dust.

6 Claims, 4 Drawing Sheets

IC CHIP AND SEMICONDUCTOR DEVICE

This is a divisional of application Ser. No. 09/964,246 filed Sep. 25, 2001, now abandoned which application is hereby incorporated by reference in its entirety.

FIELD OF THE INVENTION

The invention relates to an integrated circuit (IC) having cuttable members which can be selectively and externally cut, or cut open, and to a semiconductor device including such IC chip.

BACKGROUND OF THE INVENTION

In a process of manufacturing IC chips, cuttable members are formed in a chip so that the characteristics of the elements (e.g. resistances and capacitances) involved in the IC chip can be adjusted, or so that logical states of logic circuits can be determined by selectively cutting some of the cuttable members by a laser for example.

For example, in an IC chip provided with cuttable members in the form of fuses, some of them are fused or cut open so as to provide the components of the IC chip with required characteristics and the logical circuits with required logical states based on the data measured in a later inspection process.

The IC chip thus formed is bonded on a substrate or another IC chip to form a semiconductor device.

Unfortunately, however, the required characteristics thus obtained and/or the logical states thus determined may be lost due to short-circuiting of the cut portions by moisture and/or rust during storage, and dust during bonding of the chip on the substrate.

An IC chip is often bonded on a substrate or another IC chip using bumps (which are protruding electrodes formed for electric connections) and an anisotropic conductive film (ACF). In this approach, the ACF is placed between the IC chip and the substrate, and they are pressed together. However, fused portion can be undesirably short-circuited by conductive particles e.g. gold particles contained in the ACF.

If such short-circuiting of the cut portion(s) takes place, required characteristics of the components or logical states of the logical circuits will be lost.

Further, such unfavorable conditions can be detected in many cases only after the IC chip is bonded on the substrate or another IC chip, that is, only after the semiconductor device is completed. Hence, the above mentioned problem has been a source of manufacturing defective semiconductor devices.

SUMMARY OF THE INVENTION

An object of the invention is therefore to provide an IC chip having externally and selectively cuttable members (e.g. fuses) which are, once cut or cut open, not likely to be short-circuited by dust and/or ACF particles. The invention also provides a semiconductor device including such IC chips.

In accordance with one aspect of the invention, there is provided an IC chip comprising at least one externally and selectively cuttable member having at least one cuttable section, the cuttable member including a multiplicity of cuttable points, wherein said cuttable member remain cut or cut open so long as at least one cuttable point remains cut open.

In this arrangement, once the member is cut, the probability that the cut member is erroneously short-circuited by dust for example is exceedingly low, thereby decreasing trimming failure of the IC chip.

The cuttable portions (cuttable points) of the cuttable member need not be cut over a long distance in order to prevent undesirable short-circuit. That is, the cuttable portions can be short and cut by a laser, thereby minimizing damage of the IC chip substrate caused by the laser. Specifically, the length of such cuttable point can be as long as the size of a few conductive particles in the ACF.

In accordance with another aspect of the invention, there is provided a semiconductor device, comprising:
an IC chip having
  at least one externally and selectively cut member including at least one cut section, the cut member including a multiplicity of cut points, said cut member working normally when at least one of said cut points remains cut open, and
  bumps formed on the same side of the IC chip as the cut member in association with respective cut points;
  a substrate/another IC chip; and
  a connection member made of an anisotropic conductor and sandwiched between said IC chip and said substrate/another IC chip,
wherein
  said IC chip and said substrate/another IC chip are pressed together.

In this semiconductor device, the selectively cut member is not likely to be short-circuited by conductive particles in the ACF or by dust, thereby reducing trimming failure of the IC chip. Hence, manufacture of defective semiconductor devices will be reduced accordingly.

The cuttable section(s) may be made of polysilicon to prevent corrosion of the cut section(s).

The multiple cuttable points of at least one cuttable section may be formed in series. The cuttable sections may be formed in different configurations. For example, each of the cuttable sections may have: a linear portion having a uniform width; alternating wide portions and narrow portions connected in series; and a narrow portion formed between two wide portions.

The cuttable sections may be coupled at one ends thereof with the same electric potential and coupled at the other ends thereof with logical circuits so that the cuttable sections are connected logically in series, in stead of physically connected in series. In this case also, the cuttable sections may have different configurations. For example, each of the cuttable sections may have: a linear portion having a uniform width; and a narrow portion formed between two wide portions.

DETAILED DESCRIPTION OF THE PREFERRED EMBODIMENTS

Preferred embodiments of an IC chip of the invention and a semiconductor device including such IC chip will now be described in detail by way of example with reference to accompanying drawings.

In a process of forming an IC chip, cuttable members are formed in the chip so that the characteristics of the elements (e.g. resistances and capacitances) involved in the IC chip can be adjusted, or so that logical states of logical circuits can be determined by selectively cutting some of the cuttable members by a laser for example. The invention provides a multiplicity of cuttable points in each of cuttable members. Such cuttable member is cut or cut open at least two cuttable points so that the chip can operate normally with the cut member open so long as at least one such point remains cut open.

In what follows aluminum and polysilicon is used as a cuttable material of the cuttable members. But the cuttable material is not limited to these. For example, so-called fuses (i.e. materials that can be electrically fused) can be used. In the invention any material that can be externally and selectively cut by a laser or an electric current can be used as the cuttable members.

Figure 1:
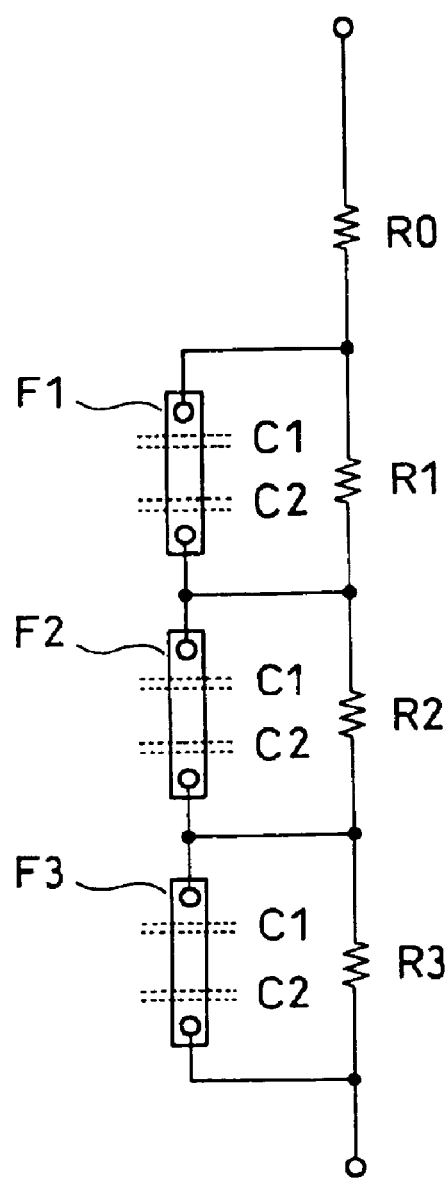
FIG. 1 shows resistors formed in an IC chip according to the invention, illustrating how the resistance of the resistors can be adjusted.

Referring to FIG. 1, there is shown an arrangement of resistors formed in an IC chip whose resistance can be adjusted. As show in FIG. 1, the resistor arrangement has four resistors R0–R3 connected in series. The resistors R1, R2, and R3 are connected in parallel with respective linear cuttable members F1, F2, and F3, all having the same uniform width. Each of the cuttable members F1–F3 is provided with at least two cuttable points C1 and C2.

In an inspection process, the resistance of the resistor arrangement is measured and appropriate one(s) of the cuttable members F1–F3 is (are) selectively cut or cut externally by a laser for example so as to provide a required resistance to the arrangement. The selected cuttable members F1–F3 are cut at more than one cuttable point.

The cut member(s) F1–F3 has (have) extremely small probability to be short-circuited by dust for example, since the member(s) is (are) multiply cut at points C1 and C2, thereby greatly reducing trimming failures of the IC chip.

It would be understood that although the example shown in FIG. 1 pertains to the trimming of series resistors, the invention may be applied equally well to trimming of parallel resistors, series parallel resistors, and condensers. Further, the invention may be applied to removal of a redundant circuit informing a programmable read only memory (PROM).

Cuttable members F1, F2, and F3 can be provided in different forms. For example, they can be a linear (serial) cuttable portion having the (same) uniform width as shown in FIG. 1 and configurations as shown in FIGS. 2–4.

Figure 2:
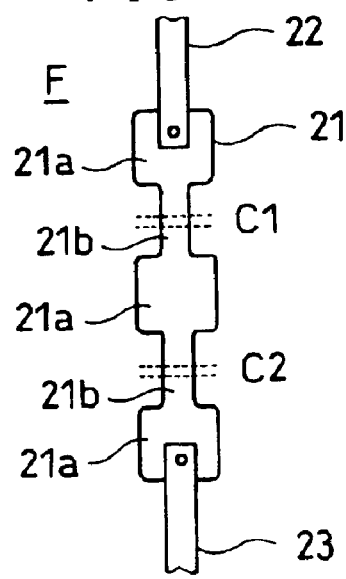
FIG. 2 shows a cuttable member embodying the invention.

A cuttable member F of FIG. 2 comprises a cuttable section 21 made of polysilicon for example and aluminum lead wires 22 and 23. The cuttable section 21 has a multiplicity of alternating wide portions 21a and narrow portions 21b connected in series. The example shown in FIG. 2 has two narrow portions 21b.

To cut the cuttable member F, both the narrow portions 21b are cut at the cuttable points C1 and C2. In the example shown herein, since the cut is performed by an externally applied laser beam, the cuttable section 21 is made of polysilicon to prevent corrosion of the cut section.

Figure 3:
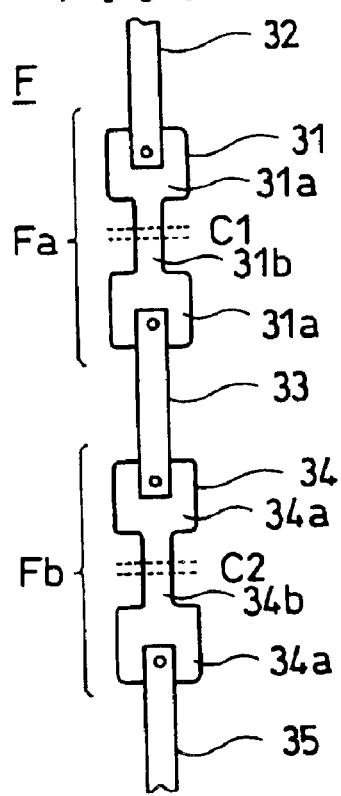
FIG. 3 shows another cuttable member embodying the invention.
Figure 4:
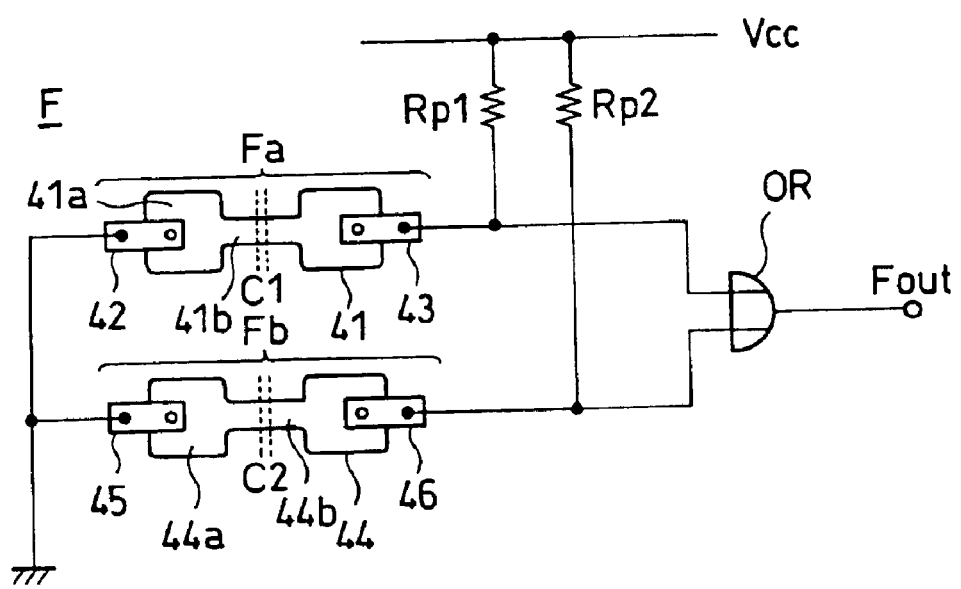
FIG. 4 shows a still another cuttable member of the invention including cuttable sections which are logically connected in series.

Referring to FIG. 3, there is shown a cuttable member F, which comprises a first and a second cuttable members Fa and Fb, respectively, connected in series, wherein the first cuttable member Fa consists of a cuttable section 31 and aluminum lead wires 32 and 33, with the cuttable section 31 made of polysilicon and having wide portions 31a and a narrow portion 31b; and wherein the second cuttable member Fb consists of a cuttable section 34 and aluminum lead wires 33 and 35, with the cuttable section 34 made of polysilicon and having wide portions 34a and a narrow portion 34b. The cuttable member F is cut at two cuttable points C1 and C2 of the respective cuttable sections Fa and Fb when the cuttable member F is chosen to be cut. Other features of the cuttable member F are the same as those of the cuttable member of FIG. 2.

Referring to FIG. 4, there is shown a cuttable member F consisting of a first and a second cuttable members Fa and Fb, respectively, which are formed separately but logically connected to function as series cuttable sections, in contrast to the cuttable members shown in FIGS. 2 and 3 consisting of physically connected two series cuttable sections.

As shown in FIG. 4, a first cuttable member Fa has a cuttable section 41 made of polysilicon which consists of a narrow portion 41b (having a cuttable point C1) between two wide portions 41a, and aluminum lead wires 42 and 43 on the opposite ends of the cuttable section 41. A second cuttable member Fb has the same structure as the member Fa. That is, it has a cuttable section 44 made of polysilicon which consists of a narrow portion 44b (having a cuttable point C2) between two wide portions 44a, the cuttable section 44 connected at the opposite ends thereof with aluminum lead wires 45 and 46.

The first and the second cuttable members Fa and Fb, respectively, are connected at one ends to the ground, and at the other ends to a power supply voltage Vcc via respective pull-up resistors Rp1 and Rp2, and to the respective input terminals of a logical OR circuit. The output Fout of the logical OR circuit represents an open or a short-circuited conditions of the series cuttable members Fa and Fb.

In cutting the cuttable member F, cuttable points C1 and C2 of the first and the second cuttable members Fa and Fb, respectively, are cut, then the output Fout of the logical OR circuit has a HIGH level. If any one of the cuttable points C1 and C2 is short-circuited by dust for example, the output Fout will remain HIGH. As a result, the cuttable member F works in the same way as the cuttable members physically connected in series as shown in FIGS. 2 and 3. In actual trimming resistors for example, however, instead of physically trimming the resistors, the resistors are switched on or off by means of transistors enabled by the output Fout of the logical OR circuit.

The first and the second cuttable members Fa and Fb, respectively, can be connected by a logical circuit as if they were physically connected in series by configuring the logical circuit to add the logical states of the first and the second cuttable members Fa and Fb in open conditions. The logical circuit is not limited to the logical OR circuit as shown in FIG. 4. It can be replaced by another logical circuit, e.g. NAND gate based on a negative logic.

It is noted that in the arrangement shown in FIG. 4, if the cuttable section 41 is made of a material that can be electrically melt (i.e. so-called fuse), the cuttable section 41 may be cut by selectively passing an electric current through it without using a laser.

Figure 5:
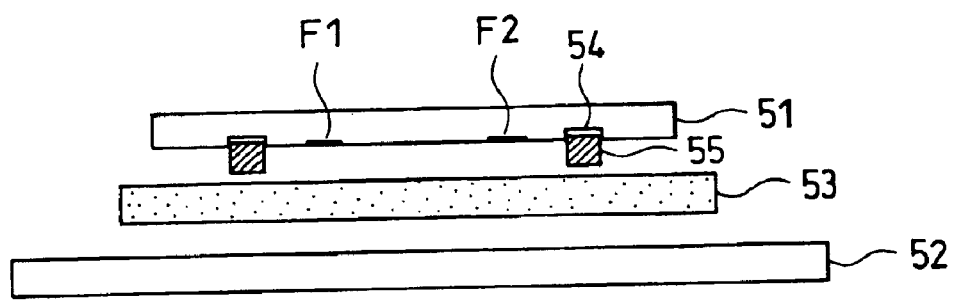
FIG. 5 shows an embodiment of a semiconductor device of the invention, before it is integrated.
Figure 6:
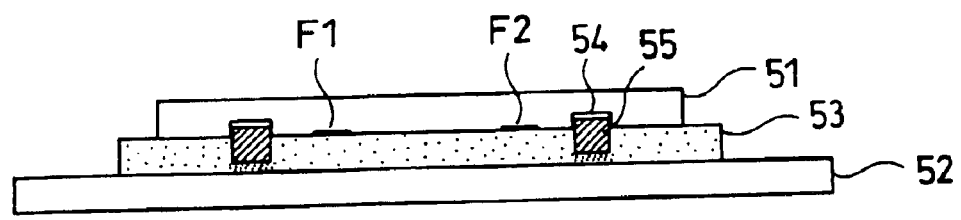
FIG. 6 shows an embodiment of a semiconductor device of the invention, after it is integrated.

FIGS. 5 and 6 shows a semiconductor device before and after an IC chip 51 thereof is integrated with a substrate 52 (or another IC chip). In the example shown herein, the IC chip 51 is provided with two cuttable members F1 and F2 and with bumps 55 provided on the same side of the IC chip as the cuttable members F1 and F2, as shown. The cuttable members F1 and F2 include selectively and externally cuttable points C1 and C2. At the time of cutting the members, both of the cuttable points are cut. The cuttable members work normally if at least one cuttable point remains cut open.

As shown in FIG. 5, the IC chip 51 is provided with bonding pads 54 for connection with lead wires, and bumps 55 on the respective bonding pads. The cuttable members F1 and F2 are provided on the side of the IC chip 51 having the bumps 55, in a manner as shown in any of FIGS. 1–4.

The substrate 52 has bonding pads (not shown) formed at locations facing the respective bonding pads 54 of the chip 51 for electric connection therebetween. The substrate is arbitrary so long as the chip 51 can be mounted thereon. For instance, it can be an IC chip, a glass epoxy substrate, a ceramic substrate, a metallic substrate, a flexible substrate, and a chip-on-film (COF) substrate in the form of tape.

An ACF 53 is placed between the IC chip 51 and the substrate 52. The ACF 53 has electrically conductive particles of gold for example dispersed in an adhesive resin layer of a predetermined thickness so that it becomes locally conductive when pressed by a pressure.

The IC chip 51 and the substrate 52, having the ACF 53 interposed between them, are pressed together, so that the corresponding bonding pads of the bumps 55 and of the substrates 52 abut against each other. They are heated as needed. Thus, portions of the ACF 53 sandwiched between the bumps 55 of the IC chip 51 and the corresponding bumps of the substrate 52 become electrically conductive under the pressure, electrically connecting the corresponding bumps together. Such electric connections are established simultaneously at all bumps, providing perfect electric connections between the IC chip 51 and the substrate 52.

Under this condition, the face of the IC chip 51 having the cuttable members F1 and F2 enters into contact with the surface of the ACF 53, as shown in FIG. 6. If the cuttable member F were designed to be cut at one point only, as is conventional cuttable member, then there can be a chance that the cut member F is short-circuited by conductive particles dispersed in the resin layer of the ACF 53.

It should be noted that in the invention, when a cuttable member F is chosen to be cut, both of the cuttable points C1 and C2 of the cuttable members F1 and F2 are cut. Accordingly, the probability that the cut points C1 and C2 are both simultaneously short-circuited by dust, water, or by conductive particles in the ACF 53 is exceedingly low. Given a probability 1/P for one cut point to become short-circuited, the probability that N cuttable points get short-circuited will be $1/(P^N)$.

Thus, the incidence of defective semiconductor IC chips arising from trimming failure of IC chips caused by the short-circuiting of cut members will be greatly reduced.

The IC chip 51 integrated with the substrate 52 (not shown) is wire-bonded to lead terminals provided on the periphery of the substrate 52 for connection with external devices, and then packaged in a protective resin.

It would be clear to a skilled person in the art that the invention may be applied to different types of cuttable members having a multiplicity of cuttable points in an IC chip irrespective of whether the IC chip is integrated with the substrate 52 or with another IC chip.

What I claim is:

1. An IC chip comprising at least one externally and selectively cuttable member having at least one cuttable section, the cuttable member including a multiplicity of cuttable points, wherein said cuttable member remain cut open so long as at least one cuttable point remains cut open, and wherein said cuttable member includes a multiplicity of cuttable sections which are coupled at one ends thereof with the same electric potential and coupled at the other ends thereof with a logic circuit, which function as if said cuttable sections were physically connected in series.

2. The IC chip according to claim 1, wherein said cuttable sections have a linear portion of a uniform width.

3. The IC chip according to claim 1, wherein each of said cuttable sections has a narrow portion formed between two wide portions.

4. A semiconductor device, comprising:

an IC chip having
at least one externally and selectively cuttable member including at least one cuttable section, the cuttable member including a multiplicity of cuttable points, said cuttable member working normally when at least one of said cuttable points remains cut open, and
bumps formed on the same side of the IC chip as the cut member in association with respective cuttable points;

a substrate or another IC chip; and a connection member made of an anisotropic conductor and sandwiched between said IC chip and said substrate or another IC chip, wherein said IC chip and said substrate or another IC chip are pressed together, and wherein said cuttable member includes a multiplicity of cuttable sections which are coupled at one ends thereof with the same electric potential and coupled at the other ends thereof with a logic circuit, which function as if said cuttable sections were physically connected in series.

5. The semiconductor device according to claim 4 wherein said cut sections have a linear portion of a uniform width.

6. The semiconductor device according to claim 4 wherein each of said cut sections has a narrow portion between two wide portions.

* * * * *